United States Patent
Vanoli et al.

(10) Patent No.: US 9,500,709 B2
(45) Date of Patent: Nov. 22, 2016

(54) METHOD FOR DETECTING A FAILURE IN A THREE-PHASE ALTERNATOR, DEVICE FOR DETECTING FAILURES AND ASSOCIATED COMPUTER PROGRAMME

(71) Applicant: Sagem Défense Sécurité, Boulogne-Billancourt (FR)

(72) Inventors: Joël Vanoli, Boulogne-Billancourt (FR); Tony Fourmont, Boulogne-Billancourt (FR)

(73) Assignee: Safran Electronics & Defense, Boulogne-Billancourt (FR)

( * ) Notice: Subject to any disclaimer, the term of this patent is extended or adjusted under 35 U.S.C. 154(b) by 0 days.

(21) Appl. No.: 14/915,179

(22) PCT Filed: Aug. 12, 2014

(86) PCT No.: PCT/FR2014/052083
§ 371 (c)(1),
(2) Date: Feb. 26, 2016

(87) PCT Pub. No.: WO2015/028744
PCT Pub. Date: Mar. 5, 2015

(65) Prior Publication Data
US 2016/0252578 A1    Sep. 1, 2016

(30) Foreign Application Priority Data

Aug. 27, 2013  (FR) .................................... 13 58204

(51) Int. Cl.
*G01R 31/34*  (2006.01)
(52) U.S. Cl.
CPC ..................... *G01R 31/34* (2013.01)
(58) Field of Classification Search
CPC ....................................................... G01R 31/34

USPC ..................................................... 324/765.01
See application file for complete search history.

(56) References Cited

U.S. PATENT DOCUMENTS 7,508,172 B1 * 3/2009 Nishimura .......... H02P 29/0241
                                                        290/40 A
2001/0054911 A1  12/2001 Kobayashi et al.
(Continued)

FOREIGN PATENT DOCUMENTS

| FR | 1 198 310 A | 12/1959 |
| FR | 2 206 507 A1 | 6/1974 |
| WO | 2013/057416 A1 | 4/2013 |

OTHER PUBLICATIONS

International Search Report mailed Sep. 14, 2015, issued in corresponding International Application No. PCT/FR2014/052083, filed Aug. 12, 2014, 6 pages.
(Continued)

*Primary Examiner* — Thomas F Valone
(74) *Attorney, Agent, or Firm* — Christensen O'Connor Johnson Kindness PLLC

(57) ABSTRACT

The invention concerns a method for detecting a failure in a three-phase alternator connected to a three-phase rectifier bridge. The method comprises the following steps — rectifying (70) the voltages generated by the three-phase alternator; — adding (76) the rectified voltages taken at the first and second phases in order to obtain a voltage sum; — subtracting (78), from said voltage sum, twice the rectified voltage taken at the third phase, in order to obtain a voltage difference; — comparing (80) the voltage difference to a high threshold and a low threshold; — detecting (82) a failure when the voltage difference is less than said low threshold or when the voltage difference is greater than said high threshold. The invention also concerns a device for detecting failures and an associated computer programme.

12 Claims, 2 Drawing Sheets

(56) References Cited

U.S. PATENT DOCUMENTS

2004/0066200 A1    4/2004  Fujioka et al.
2010/0277137 A1   11/2010  Zhao et al.
2013/0187678 A1*   7/2013  Erdos .................... G01R 31/34
                                                      324/764.01

OTHER PUBLICATIONS

Written Opinion of the International Searching Authority mailed Sep. 14, 2015, issued in corresponding International Application No. PCT/FR2014/052083, filed Aug. 12, 2014, 9 pages.

* cited by examiner

METHOD FOR DETECTING A FAILURE IN A THREE-PHASE ALTERNATOR, DEVICE FOR DETECTING FAILURES AND ASSOCIATED COMPUTER PROGRAMME

BACKGROUND AND BRIEF SUMMARY OF THE INVENTION

The invention relates to a method for detecting a failure in a three-phase alternator, and an associated failure detection device.

In particular, this detection method is adapted to detect an open circuit in a phase of the alternator and/or a short-circuit of a phase to ground.

This method may, for example, be used to detect failure of an alternator supplying a control unit of an engine, for example an engine of an aircraft. Such a control unit controls the operation of the engine according to the altitude, external pressure, external temperature, flow rate of the injected fuel, etc. In such an application, for passenger safety it is important to detect any failure of the alternator in order to quickly establish a backup power mode. The method and device for detecting failures may, however, be used in any other application where a three-phase alternator is used to supply power.

The failure detection is usually performed by measuring the phase shift between the three voltages delivered by the alternator. In the absence of failure, there is a 120° phase shift between each of these voltages. In the event of an open circuit or a short-circuit to ground, these phase relationships change. The phase shift is measured using voltages sampled at the diodes of the three-phase rectifier bridge, reshaped, and compared to reference levels. Logic signals representative of each phase are then analyzed by counting, directly by a programmable logic circuit or by an internal counter of the microprocessor.

However, the method of detecting a failure by measuring the phase shift does not detect all types of short-circuit to ground and all types of open circuit. Indeed, to protect electronic circuits from electromagnetic exposure (compliance with electromagnetic compatibility (EMC) standards—lightning), capacitors are mounted between each phase and the ground. If one phase is cut off, the corresponding input from the rectifier bridge still remains connected to the rest of the circuit via the resulting serial-parallel combinations of these capacitors. A residual voltage therefore appears at the corresponding input to the phase-shift measurement device. Under a high alternator load, this residual voltage may be higher than the normal voltage generated by the alternator when under a low load, and may be sufficient to activate the phase measurement circuit. Accordingly, this method of detecting a failure by measuring the phase shift does not allow differentiating a case of an open circuit under high load from a case with no failure when under a low load.

In addition, in case of a short-circuit to ground of one of the phases, common mode current flows in the current return wires and in the remaining phases, and causes a voltage drop proportional to the wire length. If the alternator and battery used in the alternator start-up stage are more than a few meters away from the load (for example, the engine control unit), the resulting voltage drop will disrupt the phase shift measurement.

Finally, the phase shift measurements are measurements made over time using a microprocessor or a programmable logic circuit. Such components are costly. In addition, the use of these components requires certifications which are also costly.

The object of the present invention is to provide a detection method and device for detecting an open circuit in one of the phases regardless of the presence of protective components which enclose the circuit and regardless of the operating conditions of the alternator.

Advantageously, the failure detection method and device of the invention are capable of detecting a short-circuit to ground, regardless of the length of the wiring.

Advantageously, the detection device can be implemented both with analog components or software components.

To this end, the invention relates to a method for detecting a failure of a three-phase alternator connected to a three-phase rectifier bridge; said method comprising the steps of:
 rectification of the voltages generated by the three-phase alternator in a first phase, a second phase, and a third phase,
 addition of the rectified voltage sampled from the first phase, to the rectified voltage sampled from the second phase, in order to obtain a voltage sum;
 subtraction, from said voltage sum, of twice the rectified voltage sampled from the third phase, in order to obtain a voltage difference;
 comparison of the voltage difference to a high threshold and to a low threshold; and
 detection of a failure when the voltage difference is less than said low threshold or when the voltage difference is greater than said high threshold.

According to some particular embodiments, the detection method comprises one or more of the following features:
 it further comprises a step of filtering the rectified voltages sampled from the first, second, and third phases, said filtering step occurring prior to said addition and subtraction steps.
 it further comprises a step of attenuating the rectified voltages sampled from the first, second, and third phases, said attenuation step occurring prior to said addition and subtraction steps.

The invention relates to a device for detecting a failure of a three-phase alternator, said detection device comprising:
 a three-phase rectifier bridge connected to a first phase, second phase, and third phase of said three-phase alternator;
 a summation and subtraction unit adapted for adding a rectified voltage sampled from the first phase to a voltage sampled from the second phase in order to obtain a voltage sum; said summation and subtraction unit being adapted for subtracting, from said voltage sum, twice a voltage sampled from said third phase, in order to obtain a voltage difference;
 a window comparator adapted for comparing said voltage difference to a high threshold and to a low threshold;
 a monitoring unit adapted for transmitting a failure signal when said voltage difference is less than the low threshold or when said voltage difference is greater than the high threshold.

According to some particular embodiments, the detection device comprises one or more of the following features:
 said summation and subtraction unit comprises an amplifier having an inverting input and a non-inverting input, the inverting input being connected to the first phase via a first resistor and to the second phase via a second resistor, the non-inverting input being connected to the third phase via a third resistor; and the value of the first resistor is equal to the value of the second resistor, and the value of the third resistor is equal to half the value of the first resistor.

said window comparator is a window comparator with hysteresis.

said window comparator with hysteresis comprises a first comparator and a second comparator each having an output; a first isolating diode being connected to the output of the first comparator and a second isolating diode being connected to the output of the second comparator.

it comprises an earth ground, a first, a second, and a third filter circuits adapted for filtering the voltages generated by the three-phase alternator; the first, second, and third filter circuits being connected between said earth ground and the first, second, and third phases respectively.

it comprises an earth ground, and first, second, and third attenuation circuits adapted for attenuating the voltages generated by the three-phase alternator; the first, second, and third attenuation circuits being connected between said earth ground and the first, second, and third phases, respectively.

Finally, the invention relates to a computer program comprising instructions for implementing the method mentioned above, when executed by a processor.

BRIEF DESCRIPTION OF THE DRAWINGS

The invention will be better understood by reading the following description, given by way of example only and with reference to the figures in which.

DETAILED DESCRIPTION OF THE INVENTION

Figure 1:
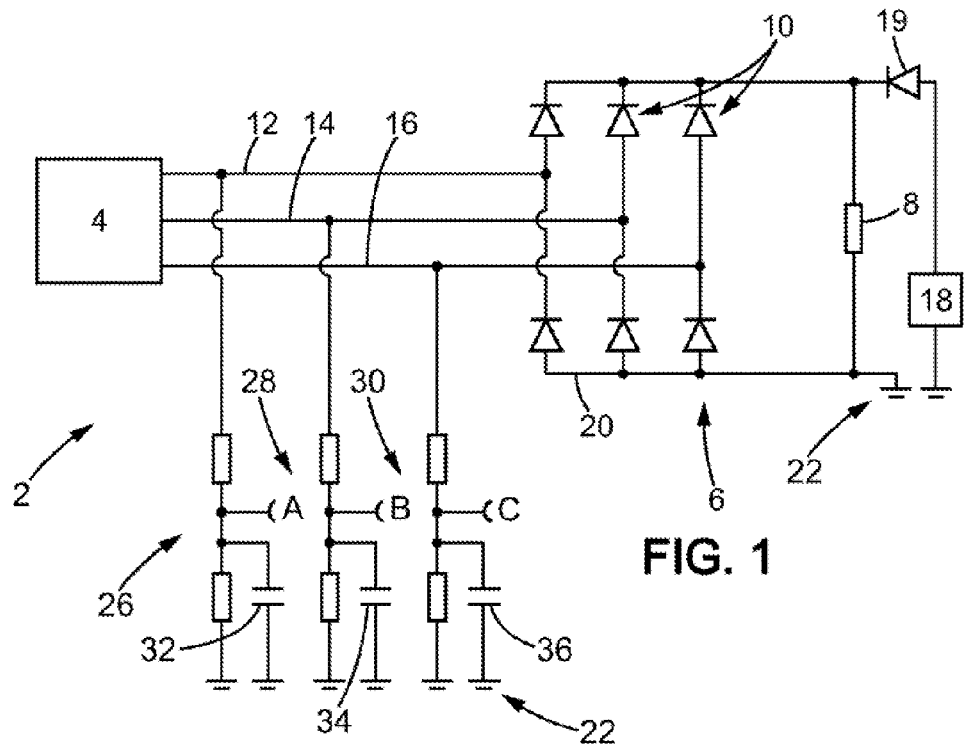
FIG. 1 is a general circuit diagram representing a circuit supplying a load and the filter and attenuation circuits of the failure detection device according to a first embodiment of the invention.

Referring to FIG. 1, the power supply circuit 2 comprises a three-phase alternator 4, a non-controlled three-phase rectifier bridge 6 connected to the three-phase alternator 4, and a load 8 electrically connected to the three-phase rectifier bridge 6.

The alternator 4 comprises a rotor and a stator having a first phase 12, a second phase 14, and a third phase 16.

The three-phase rectifier bridge 6 is implemented in a conventional manner using three pairs of diodes 10. The pairs of diodes 10 are connected in parallel. The two diodes 10 of a same pair are serially connected in the same direction. The first 12, second 14, and third 16 phases of the alternator are each connected to the midpoint of each pair of diodes 10.

The load 8 consists of any load that can be powered by a three-phase alternator 4, for example, but without limitation, such as an engine control unit, for example mounted in an aircraft. The current return line 20 from the load 8 is connected to an earth ground 22.

The power supply circuit 2 further comprises an auxiliary power source 18, connected in parallel to the alternator 4—rectifier bridge 6 assembly, through a diode 19. This auxiliary power source 18 is used during the startup phase of the three-phase alternator 4. It consists, for example, of a battery supplying a direct current of 28 volts.

The failure detection device 24 according to the invention is intended to be connected to the first phase 12, second phase 14, and third phase 16, at the output of the three-phase rectifier bridge 6, at the contact points respectively denoted A, B, and C.

The failure detection device 24 is adapted to detect a short-circuit of a phase to ground and an open circuit in a phase. It is based on the principle of equilibrium between phases of the alternator. In the absence of a failure, aside from the possible intrinsic imbalance due to manufacturing tolerances of the alternator and of the detection device components, the voltages supplied by the three phases 12, 14, 16 of the alternator are identical. The same is therefore true for the rectified voltages $V_A$, $V_B$, $V_C$ sampled at contact points A, B and C.

At equilibrium, each phase contributes equally to the power supplied to the load 8. One can therefore write:

$$V_A = V_B = V_C$$

From this, we can deduce:

$$2 \times V_C - (V_A + V_B) = 0 \qquad (1)$$

Conversely, any deviation from zero of this algebraic sum indicates the presence of a failure.

The failure detection method according to the invention is based on this principle. It is, for example, implemented by a failure detection device 24 illustrated in FIGS. 1 and 2.

Figure 2:
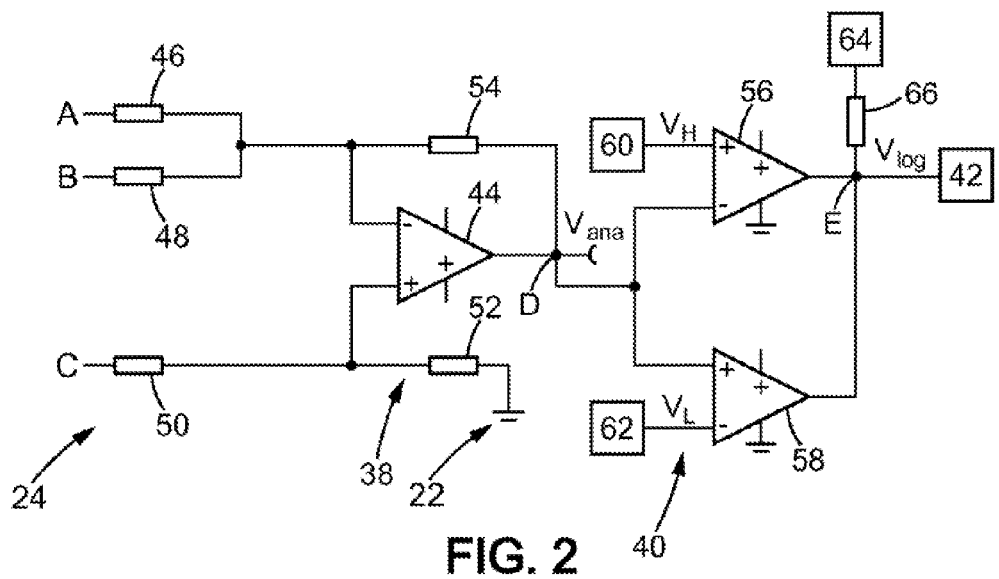
FIG. 2 is a diagram representing a portion of the failure detection device according to the first embodiment of the invention.

Referring to FIG. 2, the failure detection device 24 according to the first embodiment of the invention comprises a summation and subtraction unit 38 adapted for calculating the algebraic sum (1), a window comparator 40 having two thresholds which is adapted for comparing the result of the algebraic sum to zero, and a monitoring unit 42 adapted for transmitting a failure signal if there is a difference exceeding a given threshold.

The summation and subtraction unit 38 comprises an operational amplifier 44 mounted in a summing and differential assembly. In particular, the inverting input − of the operational amplifier 44 is connected to the first phase 12 via a first resistor 46, and to the second phase 14 via a second resistor 48. The non-inverting input + is connected to the third phase 16 via a third resistor 50 and to the earth ground 22 via a fourth resistor 52. The third resistor 50 and fourth resistor 52 are connected serially. Lastly, a fifth resistor 54 is assembled with negative feedback between the input − and the output of the operational amplifier 44.

In order to double the voltage sampled from the third phase 16, the value of the first resistor 46 is equal to the value of the second resistor 48 and the value of the third resistor 50 is equal to half the value of the first resistor 46.

The voltage sampled Vana at the output D of the summation and subtraction unit 38 is representative of the equilibrium between phases of the alternator, in other words the difference in voltage $2 \times V_C - (V_A + V_B)$. This voltage Vana is compared to zero, using the window comparator 40.

The window comparator 40 is connected to the output D of the summation and subtraction unit 38. It comprises first 56 and second 58 open-collector comparators. The non-inverting input + of the first comparator 56 is connected to a first voltage source 60 adapted to deliver a high threshold voltage $V_H$, called the high threshold $V_H$. The inverting input − of the second comparator 58 is connected to a second voltage source 62 adapted to deliver a low threshold voltage $V_L$, called the low threshold $V_L$. The inverting input − of the first comparator 56 and the non-inverting input + of the second comparator 58 are connected to the output of the operational amplifier 44 of the summation and subtraction unit 38. The output of first comparator 56 and the output of the second comparator 58 are electrically connected to a third voltage source 64 via a sixth resistor 66, called the "pull-up" resistor.

The voltage Vlog measured at the output E of the window comparator 40 has two logic states:

Vlog is equal to 1 if $V_L$<Vana<$V_H$

Vlog is equal to 0 if Vana<$V_L$ or if Vana>$V_H$

The monitoring unit 42 is connected to the output E of the window comparator 40. It is adapted to measure the voltage Vlog at this output E and to transmit a failure signal, for example to a control unit not shown, when the voltage Vlog is zero.

Referring to FIG. 1, in cases where the three-phase alternator 4 delivers high voltages, the failure detection device 24 further includes a first attenuation circuit 26 connected between the earth ground 22 and the first phase 12 in order to attenuate the voltage generated by the alternator. This attenuation circuit 26 consists, for example, of two serially connected resistors. In the same manner and for the same reasons, second 28 and third 30 attenuation circuits may be connected between the earth ground 22 and the second 14 and third 16 phases respectively.

As the voltages sampled at the output of the rectifier bridge are often noisy, a first filter circuit 32 is preferably connected between the earth ground 22 and the first phase 12 in order to filter the output voltages of the rectifier bridge 6. This filter circuit 32 consists, for example, of a capacitor connected in parallel with the leg resistor of the attenuation circuit. Similarly, second 34 and third 36 filter circuits may also be connected between the earth ground 22 and the second 14 and third 16 phases respectively.

Figure 3:
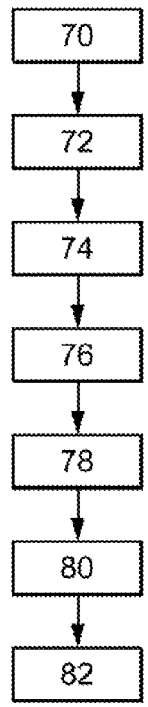
FIG. 3 is a diagram representing a second embodiment of the failure detection device according to the invention.

Referring to FIG. 3, the failure detection method of the invention comprises a step 70 in which the voltages generated on each phase of the alternator 4 are rectified.

Then, during a step 72, the rectified voltages of each phase are attenuated. During a step 74, the rectified and attenuated voltages of each phase are filtered.

In a step 76, the rectified voltage sampled from the first phase 12 is added to the rectified voltage sampled from the second phase 14. Then, during a step 78, twice the rectified voltage sampled from the third phase 16 is subtracted from the amount calculated in step 76.

In the embodiment described above, these operations are carried out by the summation and subtraction unit 38, which first adds and inverts the rectified voltage $V_A$ of the first phase 12 sampled at contact point A to the rectified voltage $V_B$ of the second phase 14 sampled at contact point B, to obtain an inverted voltage sum $-(V_A+V_B)$.

Then, the summation and subtraction unit 38 adds, to the inverted voltage sum $-(V_A+V_B)$, twice the rectified voltage $V_C$ of the third phase sampled at contact point C in order to obtain a voltage difference $2 V_C-(V_A+V_B)$.

Then, during a step 80, the window comparator 40 compares said voltage difference $2 V_C-(V_A+V_B)$ to the high threshold $V_H$ and to the low threshold $V_L$.

Finally, during a step 82, the monitoring unit 42 measures the voltage Vlog at output E and detects a failure when said voltage difference is less than the low threshold $V_L$ and when said voltage difference is greater than the high threshold $V_H$. The monitoring unit 42 can then, for example, transmit a failure signal to a control device (not shown).

The detection device 84 according to a second embodiment of the invention is similar to the detection device 24 according to the first embodiment of the invention, except that the window comparator is replaced by a window comparator with hysteresis 90 and that two isolating diodes 86, 88 are added.

The components of the detection device according to the second embodiment which are identical or similar to the components of the detection device according to the first embodiment are identified by the same references and will not be described again.

Figure 4:
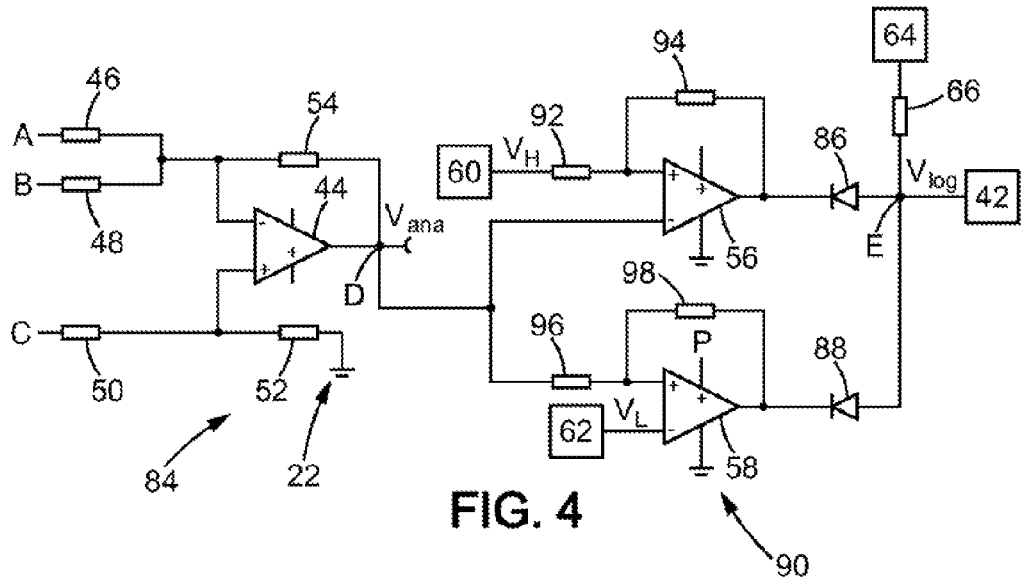
FIG. 4 is a diagram representing the steps of the detection method according to the invention.

Referring to FIG. 4, the hysteresis circuit of the window comparator includes: a seventh resistor 92 connected between the first voltage source 60 and the non-inverting input + of the first comparator 56; an eighth resistor 94 connected, with positive feedback, between the non-inverting input + and the output of the first comparator 56; and a first isolating diode 86 connected between the output of the first comparator 56 and the output E of the comparator window with hysteresis 90.

In parallel, the hysteresis circuit comprises: a ninth resistor 96 connected between the output D of the summation and subtraction unit 38 and the non-inverting input + of the second comparator 58; a tenth resistor 98 connected, with positive feedback, between the non-inverting input + and the output of the second comparator 58; and a second isolating diode 88 connected between the output of the second comparator 58 and the output E of the window comparator with hysteresis 90. The conduction direction of the first 86 and second 88 insulating diodes is from the output E to the respective output of the first 56 and second comparator 58. Isolating diode 86 is desirable so that the switching thresholds of comparator 56 are not disturbed by state changes of comparator 58. Similarly, isolating diode 88 is desirable so that the switching thresholds of comparator 58 are not disturbed by state changes of comparator 56.

Advantageously, the detection device according to this second embodiment is more stable.

According to a less advantageous embodiment, the window comparator with or without hysteresis circuit is replaced with a digital device. In this case, the output voltage Vana is converted into a digital signal by an analog-to-digital converter, then compared digitally to digital thresholds. This is done either with software in a microprocessor, or with hardware in a dedicated logic circuit.

Alternatively, the steps of the detection method illustrated in FIG. 3 are carried out by a computer program comprising instructions for implementing the method when executed by a processor of the programmable logic circuit or microprocessor type.

The invention claimed is:

1. A method for detecting a failure of a three-phase alternator connected to a three-phase rectifier bridge; said method comprising the steps of:

rectifying the voltages generated by the three-phase alternator in a first phase, a second phase, and a third phase;

adding the rectified voltage sampled from the first phase, to the rectified voltage sampled from the second phase, in order to obtain a voltage sum;

subtracting, from said voltage sum, twice the rectified voltage sampled from the third phase, in order to obtain a voltage difference;

comparing the voltage difference to a high threshold and to a low threshold; and detecting a failure when the voltage difference is less than said low threshold or when the voltage difference is greater than said high threshold.

2. The detection method according to claim 1, further comprising a step of filtering the rectified voltages sampled from the first, second, and third phases; said filtering step occurring prior to said addition and subtraction steps.

3. The detection method according to claim 1, further comprising a step of attenuating the rectified voltages sampled from the first, second, and third phases; said attenuation step occurring prior to said addition and subtraction steps.

4. A device for detecting a failure of a three-phase alternator, said detection device comprising:
   a three-phase rectifier bridge connected to a first phase, second phase, and third phase of said three-phase alternator;
   a summation and subtraction unit adapted for adding a rectified voltage sampled from the first phase to a voltage sampled from the second phase in order to obtain a voltage sum; said summation and subtraction unit being adapted for subtracting, from said voltage sum, twice a voltage sampled from said third phase, in order to obtain a voltage difference;
   a window comparator adapted for comparing said voltage difference to a high threshold and to a low threshold; and
   a monitoring unit adapted for transmitting a failure signal when said voltage difference is less than the low threshold or when said voltage difference is greater than the high threshold.

5. The detection device according to claim 4, wherein said summation and subtraction unit comprises an amplifier having an inverting input and a non-inverting input, the inverting input being connected to the first phase via a first resistor and to the second phase via a second resistor, the non-inverting input being connected to the third phase via a third resistor; and wherein the value of the first resistor is equal to the value of the second resistor, and the value of the third resistor is equal to half the value of the first resistor.

6. The detection device according to claim 4, wherein said window comparator is a window comparator with hysteresis.

7. The detection device according to claim 6, wherein said window comparator with hysteresis comprises a first comparator and a second comparator each having an output; a first isolating diode being connected to the output of the first comparator and a second isolating diode being connected to the output of the second comparator.

8. The detection device according to claim 4, comprising an earth ground, a first, a second, and a third filter circuits adapted for filtering the voltages generated by the three-phase alternator; the first, second, and third filter circuits being connected between said earth ground and the first, second, and the third phases, respectively.

9. The detection device according to claim 4, comprising an earth ground, and first, second, and third attenuation circuits adapted for attenuating the voltages generated by the three-phase alternator; the first, second and third attenuation circuits being connected between said earth ground and the first, second, and third phases, respectively.

10. A computer program, characterized in that it comprises instructions for implementing the method according to claim 1, when executed by a processor.

11. The device according to claim 5, wherein said window comparator is a window comparator with hysteresis.

12. The device according to claim 11, wherein said window comparator with hysteresis comprises a first comparator and a second comparator each having an output; a first isolating diode being connected to the output of the first comparator and a second isolating diode being connected to the output of the second comparator.

* * * * *